United States Patent
Lamarche et al.

(10) Patent No.: US 9,112,457 B1
(45) Date of Patent: Aug. 18, 2015

(54) DECOMPRESSOR

(71) Applicant: Teledyne LeCroy, Inc., Thousand Oaks, CA (US)

(72) Inventors: Francois Lamarche, New Milford, NJ (US); Anirudh Sureka, Mamaroneck, NY (US)

(73) Assignee: Teledyne LeCroy, Inc., Thousand Oaks, CA (US)

( * ) Notice: Subject to any disclaimer, the term of this patent is extended or adjusted under 35 U.S.C. 154(b) by 300 days.

(21) Appl. No.: 13/752,796

(22) Filed: Jan. 29, 2013

(51) Int. Cl.
*G06F 17/10* (2006.01)
*H03F 1/32* (2006.01)

(52) U.S. Cl.
CPC ...................................... *H03F 1/32* (2013.01)

(58) Field of Classification Search
CPC ... H03H 17/06; H03H 17/0294; H03H 17/02; H03H 17/04; H03H 17/0223
USPC .......................................................... 708/300
See application file for complete search history.

(56) References Cited

U.S. PATENT DOCUMENTS

| | | |
|---|---|---|
| 5,349,389 A | 9/1994 | Keller |
| 6,195,633 B1 * | 2/2001 | Hu ................................ 704/229 |
| 6,344,810 B2 | 2/2002 | Velazquez |
| 6,687,235 B1 | 2/2004 | Chu |
| 6,911,925 B1 | 6/2005 | Slavin |
| 7,050,918 B2 | 5/2006 | Pupalaikis et al. |
| 2009/0058521 A1 | 3/2009 | Fernandez |

* cited by examiner

*Primary Examiner* — Tan V. Mai
(74) *Attorney, Agent, or Firm* — Gordon Kessler (57) ABSTRACT

A non-linear digital filtering process is provided whereby slew rate limitation-like phenomena in analog circuitry are compensated. Particularly, a reduction of the signal amplitude with respect to the theoretical size of the signal if linearity had held is avoided. A correct phase is re-established. Customized linear filtering, up-sampling, and down-sampling before and after the non-linear digital processing minimizes the creation of harmonics. The inventive system and method for non-linear processing has few parameters and it is not limited to a polynomial series. A dedicated calibration method is also provided to adapt the value of the parameter for a precise compensation of the right amount of slew rate limitation or other similar compression. Furthermore, a calibration method is shown to adjust existing DSP filtering to accomplish a precise desired filtering even when non-linear corrections may be arbitrarily large.

28 Claims, 7 Drawing Sheets

DECOMPRESSOR

FIELD OF THE INVENTION

The present application relates to digital non-linear compression compensation.

BACKGROUND OF THE INVENTION

Analog electronic devices all have a nonlinear behavior to some extent. In particular, this non-linearity can reduce the bandwidth of certain instruments when large signals are applied, if the absolute value of the rate of change of the signals approaches the slew rate limit of the electronic components constituting the amplifier. This can result in an inaccurate representation of the signal present at the input of the analog electronic devices, such as (but not limited to) the front end amplifiers of digital storage oscilloscopes.

While look-up tables can be used to correct non-linearities present at low frequency and in the direct current (DC) case, compression, being a high frequency phenomenon, cannot be corrected by simple look-up tables, as recognized by the inventors of the present invention.

It is well known that Volterra equations can be employed to describe many dynamic non-linear phenomena by posing a non-linear differential equation that the high frequency signal follows, but in practice, in addition to the difficulty of the choice of the relevant equations, the solution is excessively complex for a real-time computation. Moreover, in the case of a digital storage oscilloscope (DSO) where the signal may not be repetitive, the presence or absence of signals beyond the Nyquist frequency cannot be ascertained. Furthermore, for the correction of non-linearities in large high frequency signals, the solution of Volterra equations requires the knowledge of the harmonics of this signal. Aliasing removes this knowledge. The method of "Volterra kernels" is distinct from a full-fledged solution of the Volterra Ordinary Differential Equations. Volterra kernels that involve a time difference $t_d$ larger than or equal to the sampling period $\tau$ can actually be used on regularly-spaced samples, and provides a means to compensate for the reduction of bandwidth at large signal amplitude, by summing a power series of non-linear terms that are related to differences between samples. One could then, in principle, establish the values $a_3$ such that the non-linearity correction $\Sigma_{j=1}^{N} a_j (f(t)-f(t-t_d)))^j$ summed to a signal $f(t)$ reproduces the data. However, the inventors of the present invention have recognized that this well-known method has an intrinsic problem with the description of the "limit" or asymptotic behavior of the signal. Because this method uses a finite order polynomial N, it cannot accurately describe a non-linearity that nears a finite limit as the stimulus approaches plus or minus infinity, neither can it accurately describe a non-linearity that diverges to plus or minus infinity when the stimulus approaches a specific value. This is a serious shortcoming of this method because errors increase considerably in the description of the circuits behavior as one approaches the slew rate limit.

A related problem is that such fit procedures have too many degrees of freedom, in fact as many degrees of freedom as the order of the polynomial used; unless extensive data taking takes place for each setting of the amplifier, the fit is underconstrained, and statistical and systematic errors develop. This is especially an acute problem in the context of a DSO front-end amplifier, which has very many possible settings (e.g. over 300 gain settings in the variable gain stage). Yet another method, the method of look-up tables, represents an even larger level of complexity. As an example, a valid compression correction method for an 8-bit analog-to-digital converter (ADC) system would be a correction based on pairs of consecutive samples. It would require 256×256=65536 parameters, that is 65536 parameters for each range (variable gain) of each channel. As recognized by the inventors of the present invention, such a method is clearly too complex for a practical implementation.

Another method for correcting non-linearities in a received signal is to introduce several quadratic terms representing the products of the current sample with the $n^{th}$ preceding sample as suggested by U.S. Utility Pat. No. 6,687,235 B1, filed Jan. 21, 2000, titled "Mitigation of non-linear signal perturbations using truncated Volterra-based Non-Linear Echo Canceler" to Chu. The Chu method is interesting as it uses consecutive sampling values to calculate a correction in a causal process. However, quadratic coefficients are not sufficient to handle the non-linearities, only cubic terms (and other "odd" non-linearities) can account for an identical absolute value of the slew rate limit in positive and negative going transitions, which is a feature of most DSO front-end amplifiers. Also, this method does not provide exact linearity for DC signals, which is a problem because most DSO front-end amplifiers have better than 1.5% Integral Non-linearity.

Another approach is to consider, as in US Patent Application US2009/0058521 A1, filed Aug. 31, 2007 titled "System and Method of Digital Linearization In Electronic Devices" to Fernandez, a correction of the non-linearity which is a multivariable polynomial function of selected variables such as the value of the measured signal at a specific time, the value of the measured signal at a different time, and the local derivative of the signal. Once again, the inventors of the present invention have determined that for the same reason that finite-order Volterra kernels fail at reproducing accurately asymptotic behavior, this method also does not work accurately in the case of large stimuli that are near the slew rate limit. Likewise, even though a judicious choice of polynomial coefficients can yield approximate linearity for DC signals, it does not provide exact linearity for DC signals.

Several existing methods provide a correction for the amplitude of compressed alternating current (AC) signals, but do not address the correction of the phase. It is obvious to a person skilled in the art that a slew rate limitation results in the signal lagging in phase (occurring later) with respect to a signal not affected by the slew rate limitation. For some applications, decompression, in other words non-linear enhancement of certain frequencies and not others, is a process in which an exact preservation of phase is not important, as in U.S. Utility Pat. No. 5,349,389, titled "Video attenuator with output combined with signal from non-linear shunt branch to provide gamma correction and high frequency detail enhancement", filed Apr. 14, 1993, to Keller. Some others have given importance to the question of phase shift when non-linearities are present. U.S. Utility Pat. No. 6,344,810, titled "Linearity Error compensator", filed Jan. 18, 2001, to Velazquez, teaches a way to emulate, and correct for, a phase-shifted distortion signal by applying distinct filtering to each power of a polynomial series of the signal—the fundamental, the square of the signal, the cube of the signal, and so on. As recognized by the inventors of the present invention, this method creates a problem because the phase shifting is implemented in specialized units that create a distinct frequency-dependent phase shift for each power of the signal in the correction. In this method, a non-zero correction at high frequency will necessarily impact the linearity for DC signals—in contradiction with the excellent linearity present in DSO front-end amplifiers. Also, like the other methods presented here, the method cannot reproduce accurately the asymptotic behavior of slew rate limit, because it fits non-linearity with a polynomial of finite order.

In U.S. Utility Pat. No. 6,911,925 B1, titled "Linearity Compensation by harmonic Cancellation", filed Apr. 2, 2004 to Slavin, an enhancement to the above invention by Velazquez is suggested; like the other methods described above, it lacks the capability to reconcile the linearity of DC signals with the wanted AC signals correction. Since it uses a finite set of powers of the signal for correction, it also lack the capability to accurately correct for non-linearity when the signal approaches an asymptotic limit, like the other methods shown above. It includes a stage of amplitude and phase correction prior to the stages of non-linear linearity correction, which amounts to a prefiltering. This prefiltering is useful to reduce the amount of tones, arising from harmonics, which may end up in band due to aliasing. However, any such prefiltering reduces the usable bandwidth. This problem is more acute for analog stages having a bandwidth close to the Nyquist frequency of the sampling system. This is part of a general problem recognized by the inventors of the present invention as being shared by all the methods so far: the correction of the harmonics is possible but in general some of the harmonics can alias back into the bandwidth of the amplifier where no harmonic to be offset is present due to the roll-off of the amplifier. The very process of correcting for the non-linearity can create new non-linearities, and if these alias back into the band of the amplifier, and do not exactly cancel a preexisting artifact, no filtering can remove it.

Another side effect of the above method of harmonic cancellation is the change in the frequency response of the signal originating from the amplitude and phase correction filter, as well as the change in the magnitude of the fundamental originating for terms having the fundamental frequency being present in the power expansion. Both these effects change the Bode Plot with respect to the Bode Plot that would be obtained without the cancellation processing and in the small signal limit. This is a serious inconvenience for DSO channels where a precisely prescribed frequency response for a sweep of sine waves is desired.

In summary, as recognized by the inventors of the present invention, while a number of methods exist in the prior art for the correction of AC non-linearities, many of these methods use analog electronics before the digitization, and those which address digital signal processing (DSP) methods use look up tables which cannot be filled accurately within a reasonable calibration time, and fits to polynomials which cannot correctly handle the asymptotic response. With few exceptions, these prior art methods do not address the phase shifts that must be compensated to faithfully represent the original signals, and those that do use algorithms such that the reproduction of non-linearities at high frequency creates discrepancies with the linearity for DC signals. These methods also can create excessive in-band aliased harmonics unless the input signal bandwidth is severely limited. All three of these phenomena render these methods useless for the faithful decompression of signals coming out of a high bandwidth front-end amplifier such as those present in DSO channels.

OBJECTS OF THE INVENTION

It is an object of this invention to provide a digital correction for the non-linear AC distortions of an amplifier system using a substantially reduced number of parameters to be fitted to the data, and to provide this correction whether the signal is quasi-linear or nearing asymptotically a slew rate limit or limit of one or more other non-linear change functions.

It is also an object of this invention to provide a correction for the phase shift associated with the non-linear AC distortions while keeping an exact linearity for constant DC signals.

It is further an object of this invention to correct for the non-linearities without creating non-linearities, such as aliased harmonics, not initially present in a set of regular samplings, and to achieve this without reducing the available bandwidth from the instrument.

It is also an object of this invention to implement such a correction combined with channel compensation in a way that optimizes uniformity of channel response across frequencies for a chosen amplitude of signals.

It is an additional object of the invention to overcome the various drawbacks of the prior art noted above recognized by the inventors of the present invention.

SUMMARY OF THE INVENTION

In order to overcome limitations of previous methods, one or more embodiments of the invention presented in this application preferably introduce a simplified method for correcting AC non-linearities, which, by design, maintains perfect linearity for DC signals. These methods may provide an amount of compensation for compression-related phase shifts which is a precise function of the amount of compression, the frequency, and a time scale parameter.

In contrast to previous prior art methods which have an arbitrarily large number of free parameters (whether polynomial coefficients or entries in look-up tables) that need to be adjusted to the data gathered about the non-linear response to stimuli, the one or more embodiments of the present invention may present methods that fit the observed non-linearities to an idealized physical model preferably comprising only two free parameters, one being a voltage scale parameter, and a second being a time scale parameter (or "time constant"). A third implicit parameter may further comprise the sampling rate of the digital data. Other desirable parameters may also be employed. Therefore, in accordance with the one or more embodiments of the present invention, a same value of the parameters is adapted to handle a large number of settings of a variable gain amplifier so that a new fit is not needed at each value of the gain. The choice of a specific form for the non-linear equation whose precise solution is calculated provides the flexibility to handle the correction of different hardware designs. The inventive determination of the size of the non-linear correction via a transcendental function which is simply re-scaled to the scale relevant to the particular amplifier considerably simplifies the process, both compared to look up tables and with respect to polynomial fits. This function allows one to produce meaningful, exact corrections to the signal even when this signal approaches asymptotically the slew rate limit or other extreme non-linearity of the system, something that a transcendental function can do but that a polynomial expansion with a finite number of terms cannot.

The invention avoids the creation of unwanted harmonics that risk aliasing back into the bandwidth of the instrument. It does so by up-sampling the data in the prefiltering stage. After the non-linear correction is performed, the data is filtered with a low-pass filter that eliminates the harmonics created by the decompression process, and is then down-sampled back to the original sample rate. In such a manner, any unwanted harmonics can be discarded without sacrificing bandwidth.

The various embodiments of the present invention also preferably incorporate the process of non-linear corrections with the process of linear filtering channel compensation so that the result of the two processes has the desired swept-sine magnitude response for the desired input amplitude.

The invention accordingly comprises the several steps and the relation of one or more of such steps with respect to each of the others, and the apparatus embodying features of construction, combinations of elements and arrangement of parts that are adapted to affect such steps, all is exemplified in the following detailed disclosure, and the scope of the invention will be indicated in the claims.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

The detailed description of the preferred embodiment presents one or more embodiments of the present invention, and will be described making reference to the drawings, like reference numbers representing like structure. The description of the various embodiments of the invention illustrates how a practical decompression algorithm may be implemented in accordance with one or more embodiments of the invention, which produces the wanted effects of restoring original amplitude and phase. First, the principle of the new inventive approach to decompression will be stated: just two parameters are preferably employed. In contrast with the successive parameters of a series expansion one can find in the prior art, each having different units ($V/V^2$, $V/V^3$, $V/V^4$, ... ), in the present application, a single parameter $V_0$ is preferably employed to describe at what voltage the non-linear effect of signal compression begins to be considerable, and it has the units of the quantity (e.g. Volts) being represented by the samples. It is called the voltage scale parameter. The other parameter preferably comprises a time scale parameter. The time scale parameter controls the threshold frequency starting at which non-linear effects become important.

To achieve this, a non-linear differential equation (or difference equation, in the discrete time case) relevant to the particular embodiment (the front-end amplifier of a DSO) is preferably written. An instructive way to understand the non-linear differential equation that applies in accordance with this embodiment of the invention is to draw a simple idealized schematic that describes the empiric behavior of a circuit for which the chosen non-linear differential equation would provide an exact correction. Note that this schematic may be considerably different from the actual schematic of the amplifier, and from the Simulation Program With Integrated Circuit Emphasis (SPICE) schematic of the main elements of the amplifier. These idealized models preferably include a small number of operational amplifiers, passive linear components such as resistors and capacitors for feedback, and a non-linear resistance, such as a diode bridge, for the non-linearity. They help the non-mathematician visualize the effect of the non-linearity. It also shows clearly that no non-linearities will occur if either the signal is small, or the signal is slow. In this model, the combination of large amplitude and high frequency is needed for non-linearities to occur, and for them to be corrected for.

A number of exact models can yield the non-linear behavior that a person skilled in the art may describe as slew rate limitation or compression. Slew rate limitation is one of several change function non-linearities that may be dealt with using the decompression method provided in accordance with one or more embodiments of the present invention. An example of another change function non-linearity might be non-linear charge diffusion in a charge coupled device (CCD) array, occurring out of very full buckets with nearly empty neighbors on both sides. When the change function is a derivative, or differences between samples approximating a derivative, it is called slew rate, as in the preferred embodiment, and the decompression method results in a non-zero phase shift, which beneficially compensates at least in part a non-linear phase shift exhibited by the physical system on which the decompression is applied. A non-linear change function applicable to systems in which no non-linear phase shift is present, such as non-linear charge diffusion in CCD arrays, may be a non-linear function of the second differences (or fourth differences). Such a change function may be called other than a slew rate, yet it is anticipated that all aspects of the various embodiments of the present invention are applicable whether the change function is a slew rate, a "derivative" function constituted by the second differences, or one or more other change functions, on which there is a limitation, saturation or other non-linearity. It is understood that in the CCD array context the "time scale constant" would be referred to as a "charge diffusion scale constant", and the "voltage scale" would be referred to as a "charge scale", as noted, without changing the nature of the method. Of course, other terms as appropriate may be further employed for different non-linear change functions.

Figure 1:
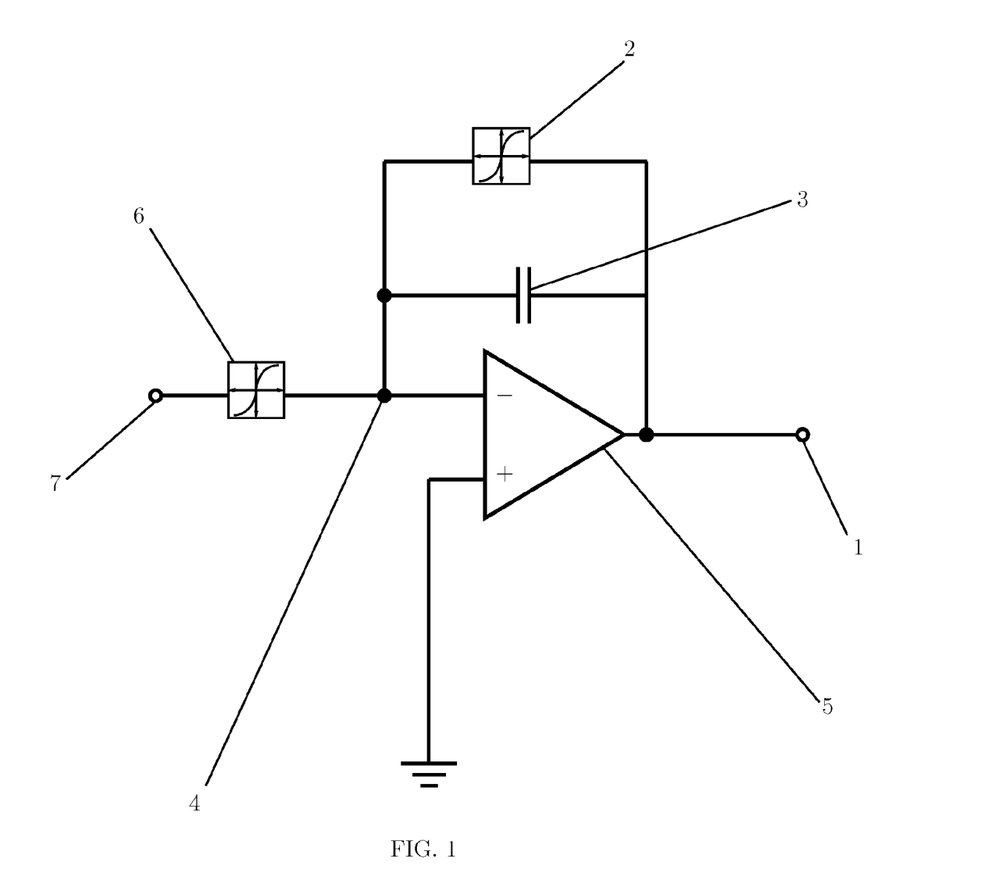
FIG. 1 is a simple schematic modeling separated compression in accordance with an embodiment of the present invention.

Among the exact models for compression, many models are easily representable via idealized schematics (especially those involving a slew rate limit). While a particular one of these schematics will now be described in accordance with this particular exemplary embodiment of the invention, several were considered and used with success in prototypes. Therefore, the various embodiments of the present invention preferably may comprise any of these alternative schematic drawings. Before the description of the main model used in a preferred embodiment of the present invention, one or more of the other models shall be discussed, although other models not discussed here may also be employed. One type, called "separated" compression, arises from an idealized schematic such as FIG. 1, in which the output voltage [1] is fed-back via a non-linear resistance [2], in parallel with a capacitor [3] of value C, to the virtual ground [4] of the operational amplifier [5], which is connected via a second identical non-linear resistance [6] to the input voltage [7]. The sign convention of the input signal is then preferably changed to have the same voltage at the input and output for DC signals. The local derivative of the output is then just proportional to the difference between separate non-linear functions of the input and output:

$$\frac{dV_{out}}{dt} G_{RL}[J(V_{in}) - J(V_{out})] \quad (1)$$

where J(V) represents the non-linear resistance's current as a function of voltage, having a limit value of $J_0$ and $G_{RL}=1/C$ is a constant such that $S_{RL}=J_0 G_{RL}$ represents the slew rate limit, the instantaneous rate of change of the output voltage when the input receives an ideal unipolar step. One can multiply each side of the equality by $G_{RL}^{-1}$, add $J(V_{out})$ to each side, apply the reciprocal of J to each side, and then swap the left and right side of the resulting equality, to obtain an exact solution:

$$V_{in} = J^{-1}\left[J(V_{out}) + \left(\frac{dV_{out}}{dt}\right)G_{RL}^{-1}\right] \quad (2)$$

Such solutions exhibit offset-dependent bandwidth.

With another other type of schematic drawings, "non-separated" non-linearities, modifications of the output with respect to the input may be generated independently of the average DC level of the signal, and thus are such that only the changes in the signal constitute sufficient information to correct the original signal:

$$\frac{dV_{out}}{dt} = G_{RL} \cdot J(V_{in} - V_{out}) \quad (3)$$

which, following similar steps as above, yields the exact solution:

$$V_{in} = V_{out} + J^{-1}\left(\frac{dV_{out}}{dt}G_{RL}^{-1}\right) \quad (4)$$

The non-separated equation and solution have the property that bandwidth does not change with offset, and therefore a constant can be simultaneously added to $V_{in}$ and $V_{out}$ and both the equation and its solution will remain true.

For the numeric implementation of these types of models, given the finite sample rate, the local slope of the sin(x)/x interpolation between the samples may be preferably used as an approximation for the derivative.

Both the separated and non-separated differential equation solutions are special cases, with a=0 and with a=1, of a more general form:

$$\frac{V_{in}}{V_o} = \alpha \frac{V_{out}}{V_o} + S^{-1}\left(S\left((1-\alpha)\frac{V_{out}}{V_o}\right) + \frac{dV_{out}}{dt}S_{RL}^{-1}\right) \quad (5)$$

where J(V) was written as $J_0 S(V/V_0)$, S being a dimensionless transcendental function of dimensionless input.

While various embodiments of the invention may employ either the separated or non-separated equations and solutions, in a preferred embodiment of the invention, a discrete time version of solutions to the non-separated equations is preferably employed. It should be noted that several operators may be substituted to the derivative without loss of generality, such as (but not limited to) a weighted sum of the first derivative and second derivative. Additionally, in a DSP filter environment, one may actually use differences between consecutive samples in place of the exact numeric derivative. Without changing the fundamental nature of the inventive model as one that models compression, any DSP filter or analog filter may be substituted for the derivative, as long as its response for a constant DC signal is zero, hence the name "change function", since a DC signal exhibits no change. This ensures that DC linearity is preserved exactly. Note that this is distinct from a model where significant non-linearities can be present at arbitrarily low frequencies and for constant signal. In that case a linearization (polynomial or look-up table) would be the first choice of approach. If a change function is only approximately zero in response to a constant DC signal, the model will give approximate corrections.

Figure 2:
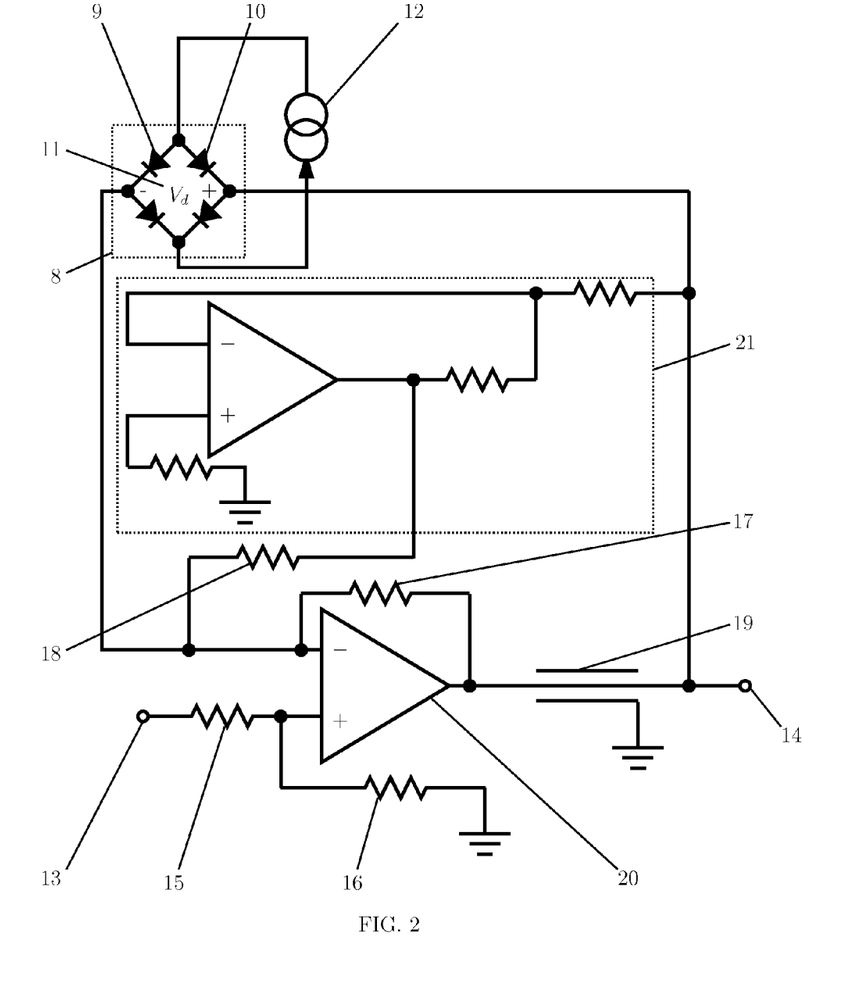
FIG. 2 is a schematic circuit that provides the exact compression in the model in accordance with a preferred embodiment of the present invention.

In such a DSP environment, whereas the implementation of an accurate derivative of the signal is hard or even perhaps impossible, the process of determining a difference between consecutive samples is easy to perform. Description of derivative, difference, and change function should therefore be considered to be interchangeable for the purposes of this application and further description. The first differences can also be a logical model element for a physical model of radio frequency circuitry, where several parasitic passive elements may combine into an effective delay line. The schematic FIG. 2 shows an idealized circuit corresponding to the DSO front-end being compressed in accordance with a preferred embodiment of the invention. The schematic of FIG. 2 includes a delay line [19], whose output voltage $V_{out}$ [14] at time t is equal to the output of the ideal operational amplifier [20] at time t−τ. An inverter [21], composed of several idealized components, is shown here on the schematic. In the case of a differential circuit schematic, this inverter [21] may comprise a connection to the negative output node.

In similarity to the equation (3) above, this circuit follows the equation:

$$V_{out}(t) - V_{out}(t-\tau) = V_0/\alpha_{RL} \cdot S\left(\frac{V_{in}(t)}{V_o} - \frac{V_{out}(t-\tau)}{V_o}\right) \quad (6)$$

where S is a dimensionless sub-linear function, $V_o$ represents the "voltage scale", $\beta_{RL}$ represents the amount of feedback per amount τ of time. This equation has the exact solution:

$$\frac{V_{in}(t)}{V_o} = \frac{V_{out}(t-\tau)}{V_o} + S^{-1}\left[\frac{\alpha_{RL}}{V_o}[V_{out}(t) - V_{out}(t-\tau)]\right] \quad (7)$$

This solution itself has an even simpler expression in the small-signal-limit:

$$V_{in}(t) \approx \beta_{RL} V_{out}(t) + (1-\alpha RL)V_{out}(t-\tau) \quad (8)$$

This particular exemplary hardware model is characterized by a sharply more important compression as the period of a large input sine wave approaches 2τ. This behavior is observed in actual amplifier hardware when employing one or more of the embodiments of the present invention. Although the circuit of the actual hardware in the preferred embodiment is more complex than the ideal circuit depicted in FIG. 2, the inventors of the present invention have determined that when this idealized schematic is simulated, it does provide, within a typical accuracy of 5% and 10°, a correct description of the actual measured amplitude, phase, and inter-modulation when linear sums of sinusoidal stimuli were injected at the input of the DSO. The constant $\alpha_{RL}$ is related to an effective slew rate limitation $S_{RL}$ by $S_{RL}=V_0/(\alpha_{RL}\tau)$. One or more of the preferred embodiments of the present invention therefore attempts to provide this exact solution (7), but implements some additional filtering which is preferable given the nature of the measured sampled signal $V_{out}$, as will be shown below.

The schematic FIG. 2 includes a diode bridge [8], which comprises a non-linear resistance of choice for the preferred embodiment, although other such appropriate non-linear resistances may be employed. For bipolar differential amplifier technology, the tan h function has been determined by the inventors of the present invention to be a good choice for the function S, because the available data taken in accordance with a preferred embodiment of the invention, comparing the input stimuli with the decompressed data, has a shape consistent with tan h. The inventors of the present invention have further determined that this result may be because the current across a diode is the exponential of the voltage, and the current across a diode bridge is the hyperbolic tangent of the differential voltage. By creating a voltage proportional to the logarithm of half of the current source's current, plus or minus the current across the diode bridge, the ideal diodes [9] and [10] in the bridge create a differential voltage $kT/e \ln((I_0-I)/I_e)-kT/e \ln((I_0-I)/I_e)=2\,kT/e \tan h^{-1}(I/I_0)$ (across the diode bridge) [11] which is an inverse hyperbolic tangent function of the current. This originates from the mathematical definition of the inverse hyperbolic tangent, $\tan h^{-1}(x)=\frac{1}{2}\ln(1+x)-\frac{1}{2}\ln(1-x)$, as a sum of logarithms. The equality across the inputs of an ideal operational amplifier [20] thus creates a schematic for the modeling of the equation (6). In the case of semiconductor diodes, the voltage scale would be fixed to a value $2\,kT/e$ determined by the Boltzmann constant, temperature, and the charge of the electron. But the model preferably includes resistors [16] and [15] that are adapted to effectively change the voltage scale of the modeled system to match one or more of the actual measured characteristics present in the physical system presented in accordance with a preferred exemplary embodiment of the invention by multiplying the input voltage $V_{in}$ [13] signal. Also, it should be noted that a different physical implementation (say, for example, using Field Effect Transistors instead of bipolar transistors) may require the use of a different special function than tan h. The choice of which particular transcendental function to use is therefore dependent upon a particular model chosen, and the use of any such function should be considered to fall within one or more of the embodiments of the present invention. Regardless of the particular transcendental function chosen in a particular embodiment, a reduced number of free parameters are employed in accordance with the various embodiments of the invention. The time scale in this idealized model is $\tau\alpha_{RL}$ and $\alpha_{RL}$ and is preferably set by the size of the feedback resistors [17] and [18] compared to the size of the diode bridge resistance, which itself is controlled by the size of the current source feeding $2I_0-2I_e$ [12].

In one or more preferred embodiments of the present invention, the delay line is preferably set to $\tau=12.5$ ps, which preferably matches a shortest sampling period of a DSO employed in accordance with a preferred embodiment of the invention, but application of the present invention, and therefore modeling, would be possible with a different delay. However, as far as DSP implementation of a solution is concerned, other delay line values may involve an inefficient re-sampling, and while considered to be part of the invention, may not be optimal. For this reason, a preferred embodiment of the present invention preferably uses an idealized delay line whose length is a single sampling interval. For moderate frequencies, the amount of compression phase shift is roughly proportional to the time constant $\tau\alpha_{RL}$, so a change in the value of $\tau$ can, to some extent, be compensated by a change of the $\alpha_{RL}$ dimensionless constant. What counts is the physical "slew rate limit", the ratio of the voltage scale to the time scale. Because differences of samples are not the same as a local derivative, this equivalence is obviously only approximate.

Figure 3:
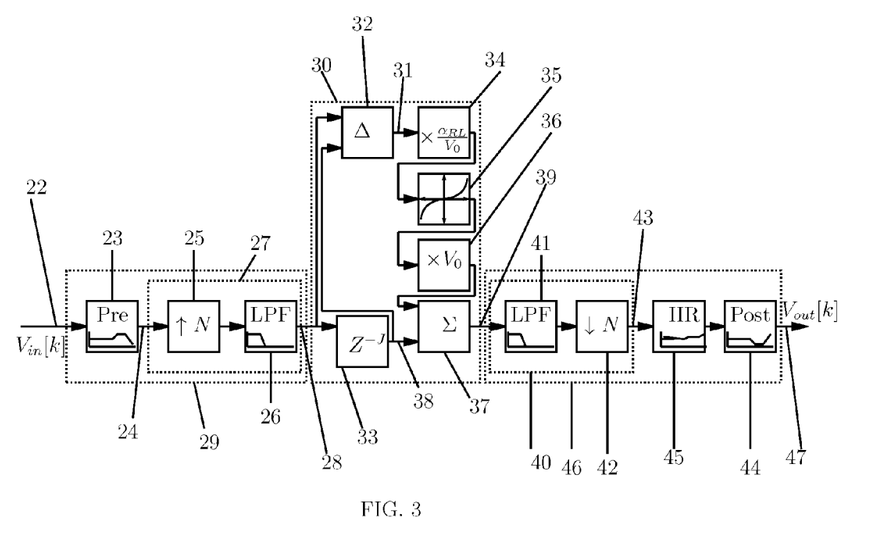
FIG. 3 is a diagram showing the decompression processing in accordance with an embodiment of the present invention.

FIG. 3 shows a particular exemplary embodiment of the decompressor, although other structures may be employed. The compressed and digitized input waveform [22] may be passed through an optional pre-shaping filter [23] which is used to direct the decompression frequency to a specific frequency band. The pre-shaping filter [23] prevents too much non-linear behavior from being introduced by the decompressor for signal frequencies (≈12 GHz in the exemplary preferred embodiment) where the linearity is satisfactory. In general, the pre-shaping filter [23] is employed to filter the signal so it represents the actual signal present at the input of active components. The shaped signal at a preshaper output [24] is then up-sampled by an interpolator [27] to a factor of N higher sample rate. This upsampling is preferably performed using a combination of processing components consisting of an up-sampler [25] and a low-pass filter [26], resulting in an up-sampled signal at the interpolator output [28]. The up-sampling operation preferably utilizes a low-pass filter [26] whose stop-band edge is preferably at a frequency (39 GHz in the preferred embodiment) a predetermined amount below the Nyquist frequency (40 GHz in the exemplary preferred samples) of the original samples. The raw decompressor [30] comprises a crucial, central non-linear calculation in accordance with the various embodiments of the present invention. First differences [31] are calculated by subtracting [32] a delayed version of itself [38] from the input of the raw decompressor [30]. In order to provide this delayed signal, a delay element [33] delays incoming values by J sampling intervals. In general, J may be any value, but in the exemplary preferred embodiment, it is preferably set equal to N, such that, if one changed N, decompressor operation would remain virtually the same, being equivalent to a decompression occurring separately among the N subset of the up-sampled data samples: those having an index equal to 0 modulo N, those having an index equal to 1 modulo N, . . . and those having index equal to N−1 modulo N. Then, a time scaler [34] preferably multiplies each successive value of the first differences [31] by the ratio of the scale parameter $\alpha_{RL}$ to the voltage scale $V_0$. Thereafter, a transcendental function block [35] calculates a transcendental function (the hyperbolic arc tangent in the exemplary preferred embodiment) of each successive scaled first differences. Next, a voltage scaler [36] preferably multiplies each result by the voltage scale $V_0$. Finally, these may be summed by an adder [37] to the delayed interpolator output values [38], resulting in a raw decompressor output [39]. The decompressed up-sampled data at the raw decompressor output [39] then preferably passes through a downsampler [40] consisting of a low-pass filter [41], and a decimator [42] which then picks one sample out of N, thus restoring the signal to the original sample rate. The decimated data at the downsampler output [43] then preferably passes through two stages of linear filtering, [45] and [44], resulting in a final decompressed output waveform [47]. First, the linear raw decompressor compensator [45] compensates for the effect of the raw decompressor in the linear limit of small signals (tan h$^{-1}$ x≈x), by applying the infinite impulse response filter (IIR):

$$V_{out,filt}(t) = \frac{V_{in}(t) + (1 - \alpha_{RL})V_{out,filt}(t - \tau)}{\alpha_{RL}} \quad (9)$$

which is the inverse of the finite impulse response filter (FIR) represented by (8).

Then, the post-shaping filter [44] performs an inverse filtering of what the pre-shaping filter [23] performed. The two linear filtering operations occurring in this filter may be combined into a single linear DSP processor if desired in accordance with an alternative embodiment of the invention. The up-sampling, and down-sampling factor N in up-sampler [25] and decimator [42] has been determined by the inventors of the present invention to preferably be three in the preferred embodiment, but of course other values may be employed in accordance with different physical systems. This particular up-sampling and down-sampling factor is preferably employed in order to suppress harmonics of the original frequency created by the raw decompressor which may lie in the frequency range above the instrument bandwidth. In general, those harmonics may cancel out harmonics generated during the compression process, some of which might be aliased into the bandwidth of the instrument by the sampling process. But in accordance with the exemplary preferred embodiment, these harmonics are not visible as they are suppressed by hardware response roll-off. Therefore, it is desirable to not generate these harmonics in this particular exemplary preferred embodiment of the invention. So, in accordance with a preferred embodiment of the present invention, the low-pass filter [41] preferably has a cutoff frequency (37.5 GHz in the exemplary preferred embodiment) just above the instrument bandwidth (36 GHz in the exemplary preferred embodiment) to remove such harmonics.

In the above description, processing may be preferably grouped into three portions: a linear pre-processing element [29], a raw decompressor [30] and a linear post-processing element [46], where it is understood that each of these portions may further contain various other types of processing not mentioned. For small signals within the bandwidth of the instrument, the net effect of the three portions is just very minute changes (their net effects amount to an exact identity in the small signal limit).

Note that, in the exemplary preferred embodiment of the invention, post-shaping filtering occurs after down-sampling. Because this filtering is linear, one may instead perform the post-filtering before down-sampling. In other words, down-sampler [40] and linear raw decompressor compensator [45] could exchange places. This opens a distinct design possibility. In this particular embodiment of the invention, in the raw decompressor [30], the delay element [33] may delay by J samples, and the post-shaping filter [44] design would still return the exact original signal in the small-signal limit, even if J≠N. To achieve such a result, the linear raw decompressor compensator [45] would preferably comprise a poly-phase version of (9) with J phases. This is similar to having a time constant equal to J/N sampling periods. While this possibility exists, in the exemplary preferred embodiment, nonetheless, J is preferably chosen to be equal to N because such a choice fits well the observed behavior of the exemplary preferred embodiment. In such a case, a poly-phase IIR filter with N phases is therefore provided, located before the 1-in-N decimator [42], and is equivalent to a simple IIR filter after the decimator [42]. The latter being more efficient, the preferred embodiment preferably employs the IIR filter after the decimator.

Figure 8:
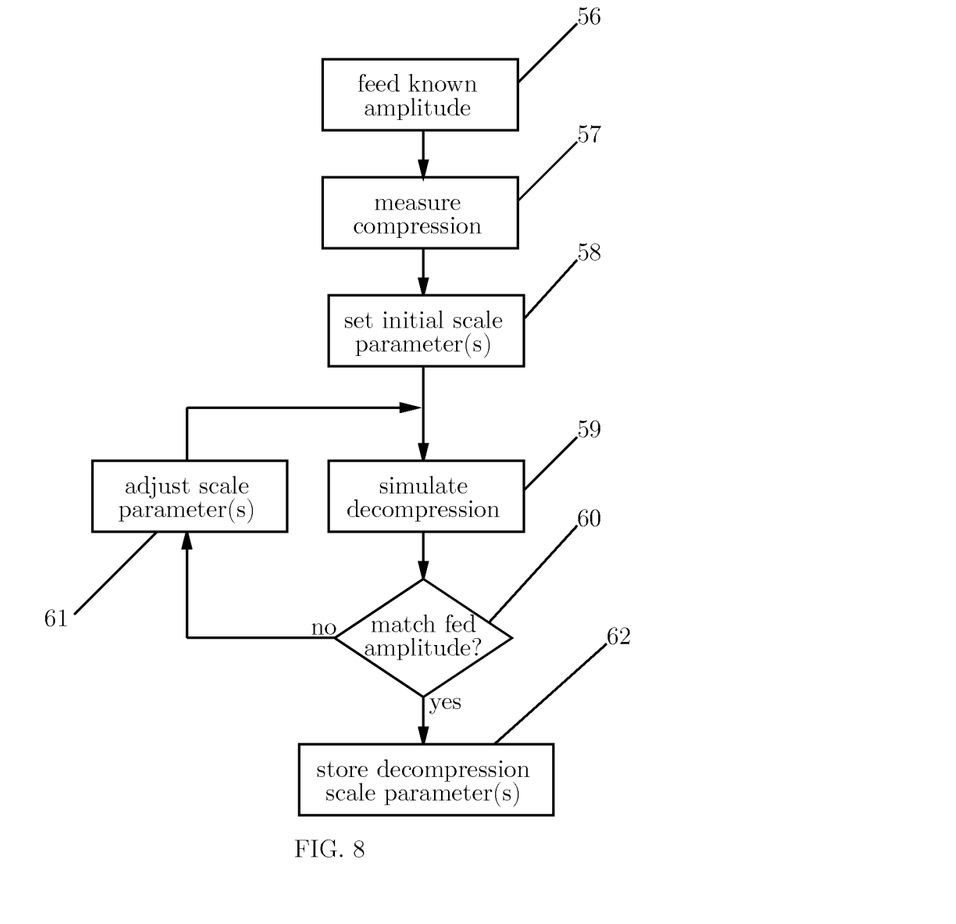
FIG. 8 is a flowchart showing the calibration procedure in accordance with an embodiment of the invention.

FIG. 8 shows the calibration process. At a frequency (near the system bandwidth) where the compression is maximum, a magnitude of the response to a sine wave stimulus is measured to a level near the full scale of the system (or digitizer, or DSO channel), where compression (and distortion) is maximal or near maximal. In the exemplary preferred embodiment, the magnitude of the response to a small signal at the same frequency is preferably also measured, for the purposes of cross-checking (and potentially, optionally, correcting) for any small variation in the linear response of the circuit. The general goal of the calibration process is to find a value for each of the two parameters, time scale and voltage scale, such that the decompression will restore the known amplitudes, via a simulation of the decompression algorithm implemented in the system (or digitizer or DSO channel).

Generally, the number n of non-linear equations needed to determine m free parameters is determined by n≥m. So, the algorithm in FIG. 8 may be adapted to fit the two scale parameters (voltage, time) based on measurements of the compression for a set of two or more sine wave amplitude or frequency conditions. However, in the exemplary preferred embodiment, only the voltage scale parameter is determined by a fit of the amount of compression. The time scale parameter is preferably set to a constant value (0.535 sampling periods) by measurement of the phase shift at large amplitude on a large number of representative channels. This is illustrated in FIG. 4, FIG. 5, FIG. 6, and FIG. 7, which are plots of four sets of data output from a system employing the exemplary preferred embodiment. Each of these figures will now be described in greater detail.

Figure 4:
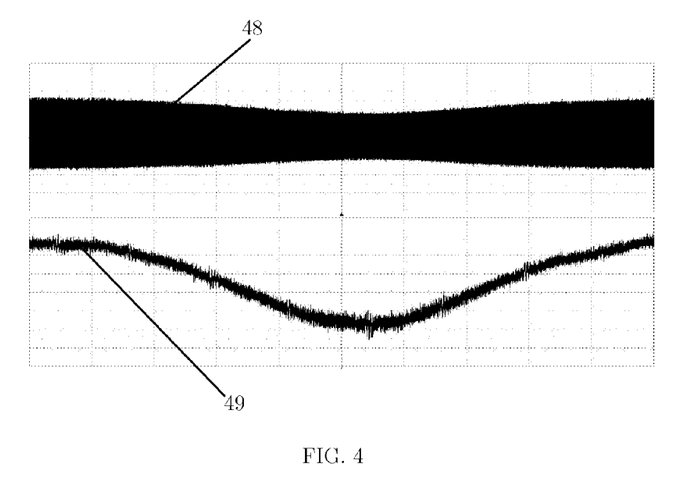
FIG. 4 is an oscilloscope display of the delay due to compression-related phase-shift, on an amplitude-modulated sine wave (without decompression)

Firstly in FIG. 4, an acquired 34.5 GHz modulated sine-wave suffering from compression [48] is shown, followed by a measurement [49], by the oscilloscope, of an amount of time that the zero-crossing point is late with respect to the time base of the generator, as a function of time. The time per division is shown as 1 μs, the modulation is approximately sinusoidal with a period of 10 μs, the vertical scale is 75 mV per division for the displayed voltage, and the vertical scale is 500 fs per division for the tracking of the zero-crossing point timing. The position of largest compression-induced time lags [49] happens when the signal is the largest, due to the well known phase shift due to compression.

Figure 5:
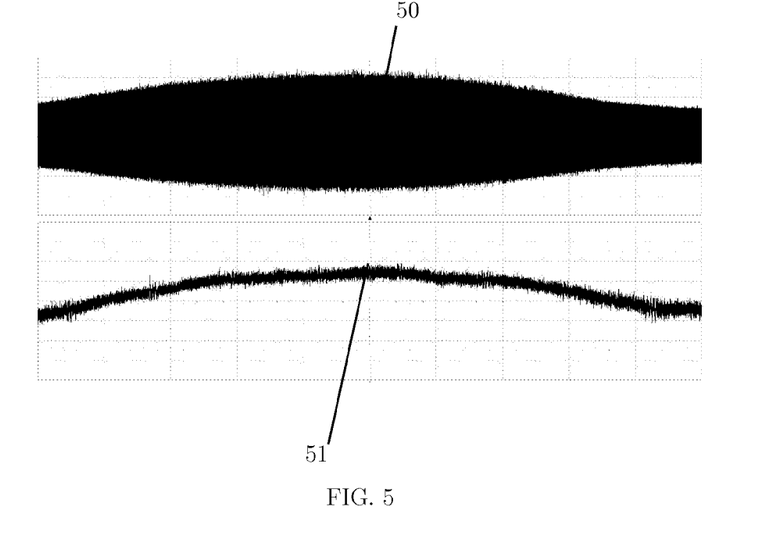
FIG. 5 is an oscilloscope display of the delay due to compression-related phase-shift, with decompression, and a too large value of the time scale parameter in accordance with an embodiment of the invention.

Secondly, in FIG. 5, the modulated sine-wave after decompression [50] is shown for a choice of a time scale parameter which is too large (at a value of 0.6τ). Decompression reduces the size of the compression-related time lags, but the position of largest time lags [51] still occurs when the signal is the largest. This is indicative that with this choice of time scale, the decompression does not fully compensate the time lags. This, in turn, is because the simulation of compression with such a time constant underestimates the time lags due to phase shift.

Figure 6:
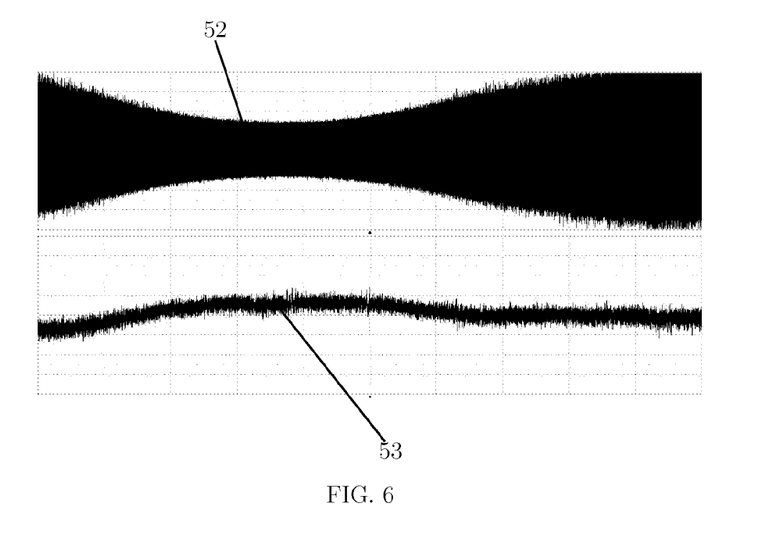
FIG. 6 is an oscilloscope display of the delay due to compression-related phase-shift, with decompression, and a too small value of the time scale parameter in accordance with an embodiment of the invention.

Thirdly, in FIG. 6, the decompressed signal[52] is shown again, but now for a choice of a time constant which is too small (at a value of 0.51τ), and now the position of largest time lags [53] occurs at the time of smallest envelope on decompressed modulated sine-wave [52]. This is indicative that with this choice of time scale, the decompression overcompensates the time lags. This, in turn, is because the simulation of compression with such a smaller time constant overestimates the time lags due to phase shift.

Figure 7:
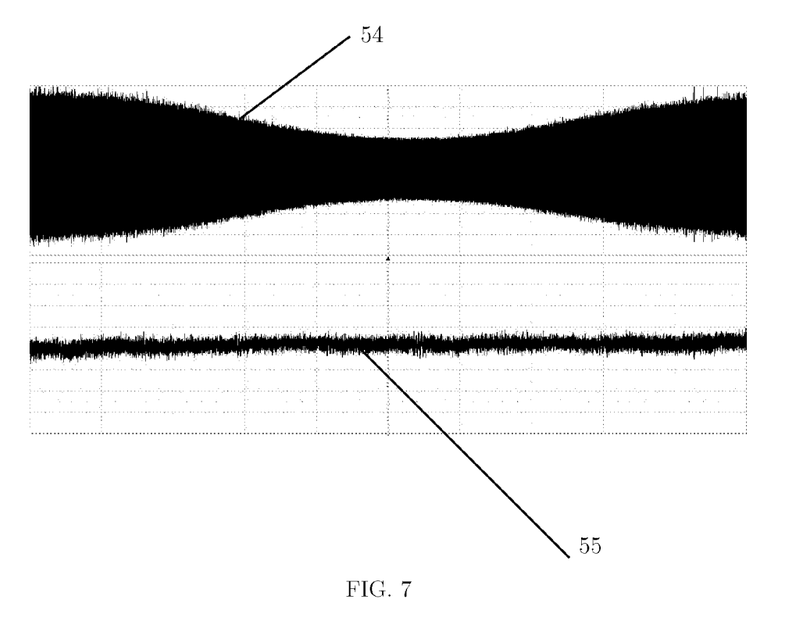
FIG. 7 is an oscilloscope display of the delay due to compression-related phase-shift, with decompression, and an optimal value of the time scale parameter in accordance with an embodiment of the invention.

Last, in FIG. 7, the decompressed modulated sine-wave [54] is shown yet again, for a value 0.535τ of the decompressor time scale. With this particular value, the flat plot of time lags [55] neither increases nor decreases at the minimums and maximums of the modulation. The decompressor corrects for the right amount of phase shift, because with 0.535τ the compression model estimates just right the amount of phase shift that occurs in the physical preferred embodiment.

The comparison of FIG. 4 versus FIG. 5, FIG. 6, FIG. 7 illustrates another important feature of the decompressor, namely, that the decompressor restores modulation depth and proper shape of the envelope to a modulated sine wave.

Given the simplification of having a single parameter to fit, the calibration process FIG. 8 in accordance with the various preferred embodiments of the invention is very simple. After the setup of input sinusoidal stimuli of sufficiently large amplitude and frequency [56], the oscilloscope acquisition is triggered to proceed to the measurement of signal size [57]. Then, the program variable representing the voltage scale parameter proceeds through a step of initialization of voltage scale parameter to half of full scale [58]. The program then enters a loop. In this loop, the value of the program variable representing the voltage scale parameter is employed to perform a simulation of decompression[59], out of which comes a signal with a new size, the decompressed amplitude. A comparison of decompressed amplitude with stimulus amplitude [60] is performed. If the two values are equal within the round-off errors of the simulation of decompression [59], the loop exits. Otherwise, a modification of voltage scale parameter [61] is made by multiplying the voltage scale parameter by the square root of the square root of the ratio of the decompressed amplitude to the stimulus amplitude. At loop's exit [62], the value of this voltage scale parameter is stored, along with the chosen time scale parameter, in the non-volatile memory of the system (or digitizer, or DSO channel). The embedded software of the oscilloscope (instrument, system, other test and measurement apparatus) preferably looks up in this non-volatile memory the relevant voltage and time scale parameters, which are relevant for the current channel and range. There, the implementation of the decompression non-linear equations result in a calculation of a corrected voltage present at the input of the system—providing an estimate for the correct voltage present at the input whether the input is the sine wave used in the setup of input sinusoidal stimuli of sufficiently large amplitude and frequency [56], a sine wave of a different frequency, or any signal (which can be thought of as the sum of sine waves of many frequencies within the bandwidth of the instrument with varying amplitude and phase).

In an oscilloscope which is employed in accordance with one or more preferred embodiments of the invention, the process of decompression preferably occurs downstream from the process of digital Bandwidth and group delay compensation as described in U.S. Utility Pat. No. 7,050,918 B2, titled "Digital group delay compensator", filed Oct. 3, 2003, to Pupalaikis et al., the contents thereof being incorporated herein by reference. The reason for this is the compression occurs when radio-frequency signals of a given amplitude are present at the input of the active components (semiconductors) that amplify the signal. A very significant part of the bandwidth reduction and phase changes that affect the signal occur after the front-end amplifier. It is thus logical to perform the decompression after the compensation, in order to retrieve the signal by performing inverse transformation in the inverse order. Generally, one could have a situation where decompression has no impact on compensation. However, it is a desired feature of the oscilloscope discussed as the particular exemplary preferred embodiment of the invention that the magnitude response for input signals having a particular size (which is not the small signal limit) be as uniform as possible as a function of frequency. If the frequency response (a.k.a. Bode plot) of the system (e.g. oscilloscope channel) is measured in the small signal limit, small errors in the measurement of the uncorrected amplitude can result in larger errors when the said uncorrected amplitude is used to calculate a compensator filter and the decompressor is used on this compensated data, because the decompressor, by its very nature, amplifies differences of amplitude. These large errors exceed the specifications targeted by the compensator alone, resulting in a problem of Bode Plot flatness. In order to avoid this problem, an algorithm shown in FIG. 9 may preferably be employed that optimizes uniformity of the magnitude response as a function of frequency, for input signals of a chosen amplitude (70% of full scale in the preferred embodiment).

Figure 9:
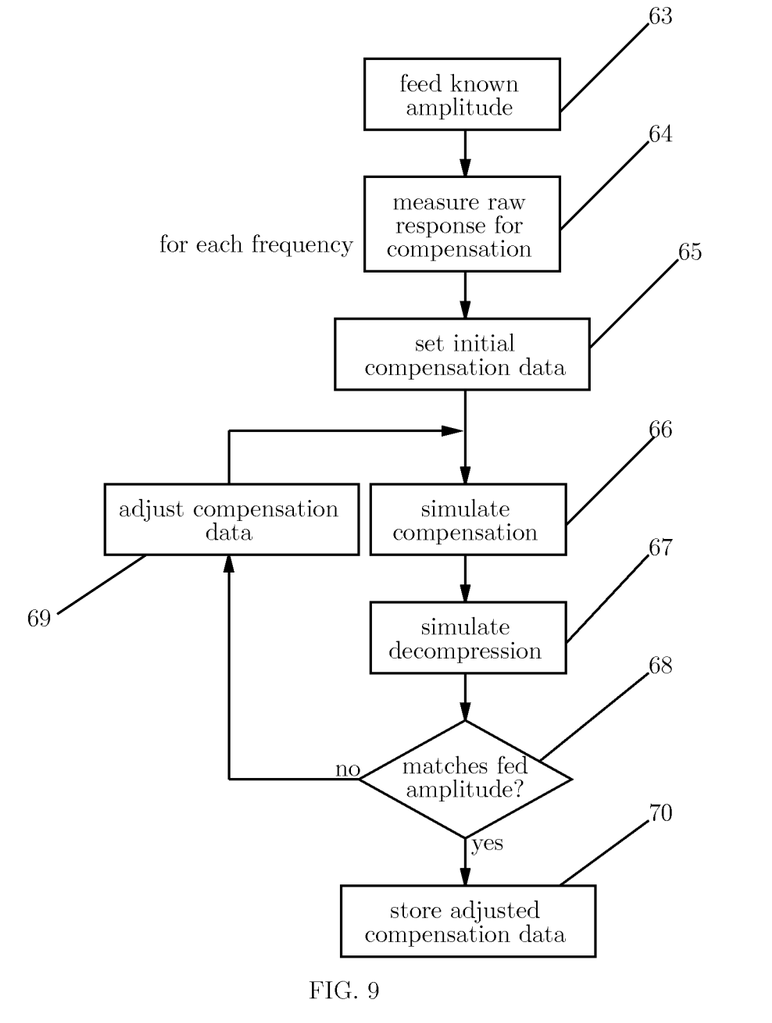
FIG. 9 is a flowchart showing the additional calibration procedure for response compensation optimization in accordance with an embodiment of the invention.

Firstly, a setup of input sinusoidal stimuli having specified amplitude [63] is performed. The next steps of the algorithm are preferably repeated for many frequencies (ranging from DC to 36 GHz by steps of 200 MHz being the set of frequencies in accordance with the preferred exemplary embodiment of the invention). In general there have to be enough discrete frequencies so that no large change in raw response nor compression occurs between consecutive points. At each of these frequencies, the sinusoidal stimulus generator having been set to said frequency, a measurement of compressed raw signal size [64] is performed. After an initialization of channel compensation data [65] is performed, a loop is entered. The trial value of the compensation data is used for a simulation of effect of compensation [66]. The resulting signal and the values of the voltage scale parameter and time scale parameter established in FIG. 8 are used to perform a simulation of effect of decompression [67]. A comparison of decompressed compensated amplitude with stimulus amplitude [68] is then performed. If the values are equal within one part per billion, one goes to the exit of the loop [70]. Otherwise, a modification of channel compensation data [69] is performed, changing the compensation data by the amount by which the goal amplitude was missed. At the exit of the loop [70], the value of the ideal compensation data is stored in the non-volatile memory of the system (or digitizer, or DSO channel). In the preferred embodiment, when referring to signal amplitude, a preferred metric for the amplitude of a signal is a root mean square size of said signal, a preferable metric is a continuous function of the samples constituting the signal, but any different metric may be used if so desired.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that this description is intended to cover all of the generic and specific features of the invention herein described and all statements of the scope of the invention which, as a matter of language, might be said to fall there between.

What is claimed is:

1. A system for compression compensation in a test and measurement apparatus, comprising:
   an acquisition element of the test and measurement apparatus for acquiring a waveform having an original sample rate;

an optical pre-shaping filter directing a decompression frequency of the acquired waveform to a specific frequency band to generate a shaped signal;

an interpolator and a low-pass filter for upsampling the shaped signal to a predefined higher sample rate;

a raw decompressor providing a raw decompressor output of the upsampled shaped signal, the raw decompressor performing the steps of:

calculating a derivative of the acquired waveform by applying a digital filter;

combining the derivative with a time scale parameter to obtain a scaled change function;

applying a transcendental function to the scaled change function to produce a corrected scaled change function;

combining the corrected scaled change function and the input waveform samples to correct the samples;

and providing a corrected waveform in accordance with the corrected samples;

a down sampler for down sampling the raw decompressed output back to the original sample rate;

a linear raw decompressor compensator for compensating for the effect of the raw decompressor in a linear limit of small signals by applying an infinite response filter; and a post shaping filter for performing an inverse filtering of the optical pre-shaping filter.

2. The system of claim 1, wherein the corrected waveform includes one or more samples whose compression effects are substantially removed.

3. The system of claim 1, wherein the change function is a slew rate, the scaled change function is a scaled slew rate, and the corrected scaled change function is a corrected scaled slew rate.

4. The system of claim 3, further comprising the steps of: applying a linear pre-processing element before calculating the derivative; applying a linear post-processing element comprising an element reversing the addition of the scaled slew rate, after adding the corrected scaled slew rate.

5. The system of claim 4, wherein the corrected waveform comprises a representative of the acquired waveform with compression effects substantially removed and wherein the corrected waveform is substantially equalized in magnitude and phase with respect to the acquired waveform.

6. The system of claim 4, wherein the linear post processing element employs an IIR process.

7. The system of claim 4, wherein processing employing the linear pre-processing element further includes an up-sampling operation.

8. The system of claim 7, wherein the plurality of samples comprises a periodic subset of samples associated with the pre-processed waveform.

9. The system of claim 8, wherein the transcendental function is the product of a scale parameter and an elemental transcendental function having an argument comprising the ratio of the scaled slew rate to the scale parameter.

10. The system of claim 9, wherein the elemental transcendental function is hyperbolic arc tangent.

11. The system of claim 1, wherein the scale parameter is determined by a method, comprising the steps of:

(a) estimating an initial scale parameter value;

(b) providing a sinusoidal waveform;

(c) applying decompression processing, further comprising the steps of:

(d) applying a linear pre-processing element, including at least up-sampling;

(e) calculating a derivative of the sinusoidal waveform by applying a digital filter;

(f) combining the derivative with a time scale parameter to obtain a scaled change function;

(g) applying a transcendental function, the product of a scale parameter and an elemental transcendental function, having an argument comprising the ratio of the scaled change function to the scale parameter, to produce a corrected scaled change function; and (h) combining the corrected scaled change function with the sinusoidal waveform samples to simulate correcting the samples;

(i) applying a linear post-processing element comprising an element reversing the addition of the scaled change function;

(j) providing a resulting simulation signal in accordance with the post-processed corrected samples;

(k) calculating a signal size metric on the resulting simulation signal;

(l) comparing the calculated signal size metric to a predefined signal size metric;

(m) modifying the estimated scale parameter value in accordance with the comparison; and repeating steps (b)-(m) until the calculated signal size metric is equal to the predefined signal size metric within a predefined error size.

12. The system of claim 11, wherein the change function is a slew rate, the scaled change function is a scaled slew rate, and the corrected scaled change function is a corrected scaled slew rate.

13. The system of claim 11, further comprising the step of calibrating a test and measurement apparatus channel by defining the signal size metric to be root mean square;

defining the predefined signal size metric to be a known root mean square size of a predefined stimulus; and defining the size of the sinusoidal waveform to match the size of an acquired waveform with the predefined stimulus applied thereto.

14. The system of claim 1, whereby a linear digital filtering process employed by the linear raw decompressor compensator is modified to achieve a better flatness, by applying a sinusoidal physical stimulus at one of a plurality of calibration frequencies;

acquiring a signal in accordance with the applied sinusoidal physical stimulus;

calculating a signal size metric on the acquired signal;

applying a virtual sinusoidal stimulus at the one of a plurality of calibration frequencies;

(a) simulating the effects of the linear digital system in response to a change in its parameters affecting its gain at the one of a plurality of calibration frequencies;

(b) applying decompression processing, further comprising the steps of:

(c) applying a linear pre-processing element, including at least up-sampling;

(d) calculating a derivative of the sinusoidal waveform by applying a digital filter;

(e) combining the derivative with a time scale parameter to obtain a scaled change function;

(f) applying a transcendental function, the product of a scale parameter and an elemental transcendental function, having an argument comprising the ratio of the scaled change function to the scale parameter, to produce a corrected scaled change function; and (g) combining the corrected scaled change function with the sinusoidal waveform samples to simulate correcting the samples;

(h) applying a linear post-processing element comprising an element reversing the addition of the scaled change function;
(i) providing a resulting simulation signal in accordance with the post-processed corrected samples;
(j) calculating a signal size metric of the resulting simulation signal;
(k) modifying the parameter affecting the gain of the linear digital filter;
(l) repeating steps (a)-(k) until the signal size metric of the resulting simulation signal is equal to the signal size metric of the applied sinusoidal physical stimulus; and
repeating step (l) for a next of the plurality of calibration frequencies until all the calibration frequencies have been employed.

15. The system of claim 14, wherein the change function is a slew rate, the scaled change function is a scaled slew rate, and the corrected scaled change function is a corrected scaled slew rate.

16. The system of claim 14, wherein the set of calibration frequencies covers the bandwidth of a predetermined hardware system.

17. The system of claim 1, wherein the raw decompressor further provides the raw decompressor output of the upsampled shaped signal in accordance with a method, comprising the steps of:
providing a plurality of samples associated with an acquired waveform with one or more compression effects;
applying decompression processing, further comprising the steps of:
calculating a derivative of the acquired waveform by applying a digital filter;
combining the derivative with a time scale parameter to obtain a scaled change function;
calculating a transcendental function of the acquired waveform;
combining the scaled change function and the transcendental function of the acquired waveform;
calculating values of a reciprocal transcendental function of the combination of the scaled change function and the transcendental function of the acquired waveform; and
providing a corrected waveform in accordance with the calculated reciprocal transcendental function values.

18. The system of claim 17, wherein the change function is a slew rate, the scaled change function is a scaled slew rate, and the corrected scaled change function is a corrected scaled slew rate.

19. The system of claim 1, wherein the raw decompressor further provides the raw decompressor output of the upsampled shaped signal in accordance with a method, comprising the steps of:
providing a plurality of samples associated with an acquired waveform with one or more compression effects;
applying decompression processing, further comprising the steps of:
calculating a derivative of the acquired waveform by applying a digital filter;
multiplying the derivative by a time scale parameter to obtain a scaled change function;
calculating a transcendental function of the acquired waveform reduced by a predetermined percentage;
combining the scaled change function and the transcendental function of the reduced acquired waveform;
calculating values of a reciprocal transcendental function of the combination of the scaled change function and transcendental function;
calculating a remaining percentage of the acquired signal by reducing the acquired waveform by 1 minus the predetermined percentage;
combining the remaining percentage of the acquired signal and the values of the reciprocal transcendental function; and
providing a corrected waveform in accordance with the combination of remaining percentage of acquired signal and reciprocal transcendental function values.

20. The system of claim 19, wherein the change function is a slew rate, the scaled change function is a scaled slew rate, and the corrected scaled change function is a corrected scaled slew rate.

21. The system of claim 19, wherein the corrected waveform includes one or more samples whose compression effects are substantially removed.

22. The system of claim 19, further comprising the steps of:
applying a linear pre-processing element before calculating the derivative; and
applying a linear post-processing element comprising an element partly or completely reversing the effects of adding scaled change function in the previous steps.

23. The system of claim 22, wherein the corrected waveform comprises a representative of the acquired waveform with compression effects substantially removed, and wherein the corrected waveform is substantially equalized in magnitude and phase with respect to the acquired waveform.

24. The system of claim 22, wherein the linear post processing element employs an IIR process.

25. The system of claim 22, wherein processing employing the linear pre-processing element further includes an up-sampling operation.

26. The system of claim 25, wherein the plurality of samples comprises a periodic subset of samples associated with the pre-processed waveform.

27. The system of claim 26, wherein the transcendental function, and the reciprocal transcendental function, are products of a scale parameter and of, respectively, an elemental transcendental function, and a reciprocal elemental transcendental function, each having an argument comprising the ratio of their respective arguments to the scale parameter.

28. The system of claim 27, wherein the elemental transcendental function is hyperbolic arc tangent.

* * * * *